US008823850B2

United States Patent
Rysinski et al.

(10) Patent No.: US 8,823,850 B2
(45) Date of Patent: Sep. 2, 2014

(54) IMAGE PROCESSING SYSTEM WITH ON-CHIP TEST MODE FOR COLUMN ADCS

(75) Inventors: Jeff Rysinski, Pasedena, CA (US); Yibing Michelle Wang, Temple City, CA (US); Sang-Soo Lee, Cupertino, CA (US)

(73) Assignee: Hynix Semiconductor Inc., Gyeonggi-do (KR)

( * ) Notice: Subject to any disclaimer, the term of this patent is extended or adjusted under 35 U.S.C. 154(b) by 555 days.

(21) Appl. No.: 12/981,970

(22) Filed: Dec. 30, 2010

(65) Prior Publication Data

US 2012/0169909 A1    Jul. 5, 2012

(51) Int. Cl.
*H04N 5/335* (2011.01)
*H03M 1/10* (2006.01)
*H04N 5/228* (2006.01)
*H04N 17/00* (2006.01)
*H04N 5/378* (2011.01)
*H04N 5/374* (2011.01)
*H03M 1/56* (2006.01)
*H03M 1/12* (2006.01)

(52) U.S. Cl.
CPC ............. *H04N 5/374* (2013.01); *H04N 17/002* (2013.01); *H04N 5/378* (2013.01); *H03M 1/1033* (2013.01); *H03M 1/56* (2013.01); *H03M 1/123* (2013.01)
USPC .......................... 348/308; 341/120; 348/222.1

(58) Field of Classification Search
USPC ........ 348/241, 308, 294, 302, 222.1; 341/120
See application file for complete search history.

(56) References Cited

U.S. PATENT DOCUMENTS

| 6,133,862 | A  | * | 10/2000 | Dhuse et al. ................... 341/118 |
| 6,388,245 | B1 | * | 5/2002  | Lee ............................ 250/208.1 |
| 6,903,670 | B1 | * | 6/2005  | Lee et al. ...................... 341/118 |
| 8,040,414 | B2 | * | 10/2011 | Nakao et al. .................. 348/294 |
| 8,094,215 | B2 | * | 1/2012  | Richardson .................... 348/241 |
| 8,275,213 | B2 | * | 9/2012  | Richardson .................... 382/274 |

FOREIGN PATENT DOCUMENTS

| KR | 1020040071839 | 8/2004 |
| KR | 1020040093939 | 11/2004 |
| KR | 1020040095987 | 11/2004 |
| KR | 1020040095990 | 11/2004 |

OTHER PUBLICATIONS

Notice of Preliminary Rejection issued by the Korean Intellectual Property Office on Feb. 25, 2013.
Notice of Allowance issued by the Korean Intellectual Property Office on Nov. 14, 2013.

* cited by examiner

*Primary Examiner* — Ahmed A Berhan
(74) *Attorney, Agent, or Firm* — IP & T Group LLP (57) ABSTRACT

An image processing system includes a pixel array including a plurality of regular pixel columns and at least one test pixel column, a plurality of column analog-to-digital converters (ADCs) configured to correspond to the regular pixel columns and convert analog input signals into digital signals, and a switching block configured to provide output signals of the regular pixel columns to input ends of the corresponding column ADCs in a normal mode, and provide in common an output signal of the test pixel column to the input ends of the column ADCs in a test mode, wherein the test pixel column generates signals having a minute voltage different from one row to another row.

12 Claims, 8 Drawing Sheets

IMAGE PROCESSING SYSTEM WITH ON-CHIP TEST MODE FOR COLUMN ADCS

BACKGROUND OF THE INVENTION

Exemplary embodiments of the present invention relate to an image processing system, and more particularly, to an image processing system having an on-chip test mode for column-parallel analog-to-digital converters (ADCs).

Proliferation of complementary metal-oxide-semiconductor (CMOS) image sensors (CIS) in consumer markets has been accelerated by the adoption of CIS in many popular consumer electronics applications including, e.g., mobile handsets. This trend, together with the rapid growth in smart phone markets, has led manufacturers and consumers to desire apparently ever-increasing resolutions in their CIS applications. In this context, CIS designers have remained constrained by issues relating to die sizes and aspect ratios, costs, power consumption, and others.

As sensor resolution increases, operation of the sensors in desired frame rates, e.g., a full HD frame rate, involves higher data conversion rates. Many typical applications of high resolution sensors employ single-slope column-parallel analog-to-digital converters (ADCs) at least to achieve these higher data conversion rates while dissipating low power. For example, in comparison to competing architectures, like serial pipeline ADC architectures, the column-parallel ADC architecture may achieve lower read noise, and thus higher dynamic range, due to reduced bandwidth circuit readouts for each column's ADC.

Typical single-slope column-parallel ADCs may tend to experience both row-wise and column-wise noises from various sources. For example, some row-wise noise may result from power supply movement, and some column-wise noise which is so called column fixed-pattern noise (CFPN) may result from device and parasitic mismatch. The various types of noise may cause undesirable effects including, e.g., limitations on the sensitivity of the CIS, visible artifacts in the CIS output, and the like. Thus, it may be desirable to provide techniques for addressing these row-wise and/or column-wise noise sources.

Meanwhile, the performance of column-parallel ADCs employed in a CIS may be tested by directly inputting an external analog signal to the column-parallel ADCs and obtaining a digital output value, or by directly irradiating light to a pixel array.

However, the method of directly inputting an external analog signal from the outside to the ADCs has limitation in the test itself, and the method of irradiating light to a pixel array takes much time to test the performance of the column-parallel ADCs because the intensity of the radiation should be controlled in several steps to acquire an accurate test result.

SUMMARY OF THE INVENTION

Exemplary embodiments of the present invention are directed to an image processing system that may perform an on-chip test onto column analog-to-digital converters (ADCs).

In accordance with an exemplary embodiment of the present invention, an image processing system includes a pixel array including a plurality of regular pixel columns and at least one test pixel column, a plurality of column ADCs configured to correspond to the regular pixel columns and convert analog input signals into digital signals, and a switching block configured to provide output signals of the regular pixel columns to input ends of the corresponding column ADCs in a normal mode, and provide in common an output signal of the test pixel column to the input ends of the column ADCs in a test mode, wherein the test pixel column generates signals having a minute voltage different from one row to another row.

In accordance with another exemplary embodiment of the present invention, an image processing system includes a pixel array including a plurality of regular pixel columns and at least one test pixel column, a plurality of regular column ADCs configured to correspond to the regular pixel columns and convert analog input signals of the regular pixel columns into digital signals, and at least one test column ADC configured to convert analog input signals of the test pixel column into digital signals, wherein the test pixel column generates signals having a minute voltage different from one row to another row.

DESCRIPTION OF SPECIFIC EMBODIMENTS

A further understanding of the nature and advantages of examples provided by the disclosure may be realized by reference to the remaining portions of the specification and the drawings wherein like reference numerals are used throughout the several drawings to refer to similar components. In some instances, a sub-label is associated with a reference numeral to denote one of multiple similar components. When reference is made to a reference numeral without specification to an existing sub-label, the reference numeral refers to all such similar components.

The following description provides exemplary embodiments only and is not intended to limit the scope, applicability or configuration of the invention. Rather, the ensuing description of the embodiments will provide those skilled in the art with an enabling description for implementing embodiments of the invention. Various changes may be made in the function and arrangement of elements without departing from the spirit and scope of the invention as set forth in the appended claims.

Thus, various embodiments may omit, substitute, or add various procedures or components as appropriate. For instance, it should be appreciated that in alternative embodiments, the methods may be performed in an order different than that described, and that various steps may be added, omitted or combined. Also, features described with respect to certain embodiments may be combined in various other embodiments. Different aspects and elements of the embodiments may be combined in a similar manner.

It should also be appreciated that the following imaging systems and methods may be components of a larger system, wherein other procedures may take precedence over or otherwise modify their application. Also, a number of steps may be required before, after, or concurrently with the following embodiments.

Figure 1:
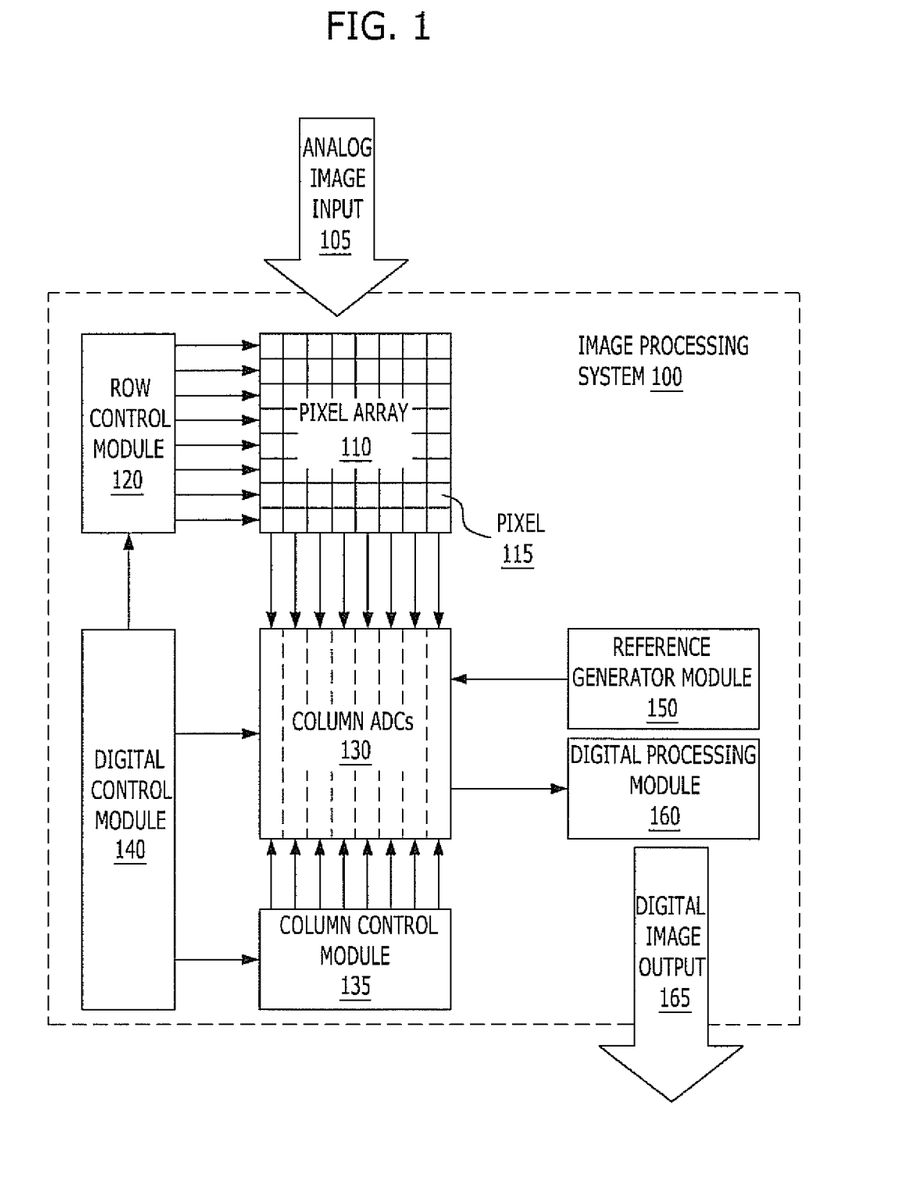
FIG. 1 is a block diagram illustrating an image processing system in accordance with an exemplary embodiment of the present invention.

Turning first to FIG. 1, a simplified functional block diagram is shown of an exemplary image processing system 100, according to various embodiments. The image processing system 100 includes a pixel array 110 configured to receive analog image input 105 information and output a corresponding signal. The signal is converted into a digital representation by column ADCs 130 and passed to a digital processing module 160 for further processing in the digital domain. The digital processing module 160 outputs a digital image output 165, which is a digital representation of the analog image input 105.

Generally, light interacts with each pixel 115 of the pixel array 110 as analog information. The pixels 115 are arranged in rows and columns, which effectively define the resolution of the pixel array 110 and affect the amount of analog image input 105 data that is converted by the image processing system 100 into digital image output 165 data. Various architectures for this type of conversion typically fall into two categories. According to one category, columnar data from each row of pixels 115 is selected and multiplexed, and the multiplexed data is converted into digital data using a serial ADC approach. According to another category, the columnar data is not multiplexed, and instead, each row's data is converted column-wise into digital data by a column-parallel ADC process. FIG. 1 illustrates this second category.

Analog image input 105 data is detected at the pixel array 110. A row control module 120 selects each row's data and passes the data to a set of column ADCs 130. Each column ADC 130 processes one column of the row-wise data, i.e., one pixel 115, in parallel according to a column control module 135 to generate corresponding digital data for the row. The row control module 120 and the column control module 135 may be further controlled by a digital control module 140.

Different architectures are available within the column-parallel ADC approach for performing the analog-to-digital conversion. One such approach is known as "single-slope" ADC. According to single-slope ADC approaches, a reference signal, generated by a reference generator module 150, ramps with a certain slope and is compared to a pixel 115 signal level generated according to the analog image input 105 received by the corresponding pixel 115. The column ADCs 130 detect a crossover point, at which the ramp signal crosses the pixel 115 signal level. This crossover point may be detected using analog or digital technique. For example, as described herein, embodiments use digital technique, e.g., a counter, to determine a value corresponding to the crossover point.

The reference generator module 150 is typically coupled globally with the entire column ADCs 130, so that the column ADCs 130 share a common reference signal.

Figure 2:
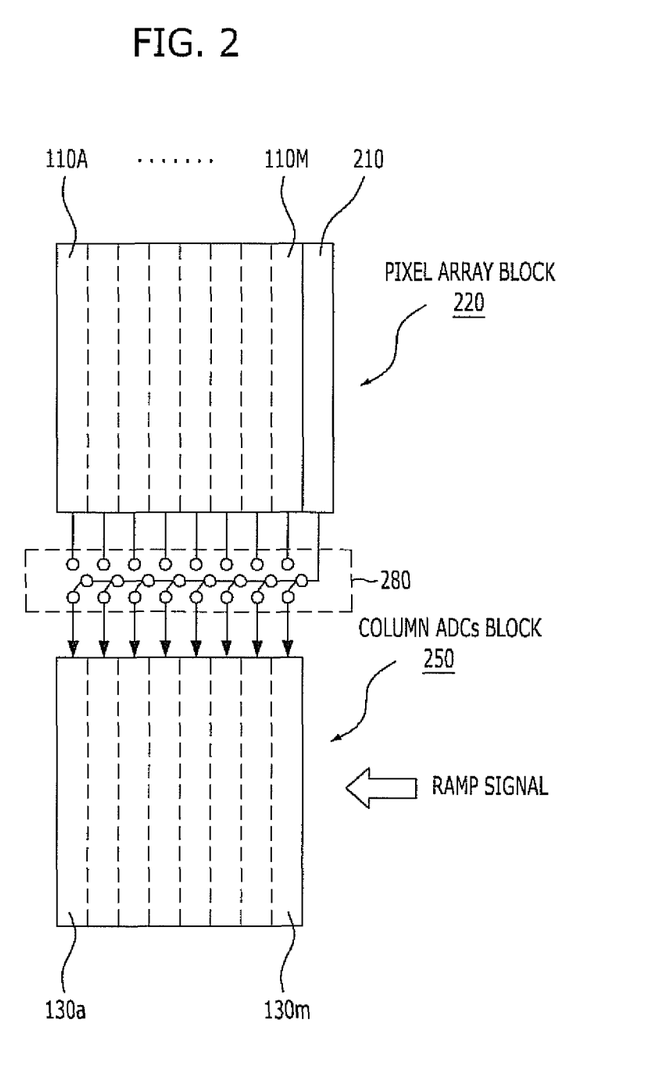
FIG. 2 is a block diagram illustrating a system in accordance with a first exemplary embodiment of the present invention.

FIG. 2 is a block diagram of a system in accordance with a first embodiment of the present invention. Referring to FIG. 2, the system includes a pixel array block 220, a column ADCs block 250, and a switching block 280. The pixel array block 220 includes a plurality of regular pixel columns 110 and at least one test pixel column 210. As described below with reference to FIG. 3, the test pixel column 210 generates a signal having a minute voltage difference from one row to another row. The column ADCs block 250 includes a plurality of column ADCs 130 which correspond the regular pixel columns 110 respectively. The column ADCs block 250 receives a ramp signal, which is a reference signal, as mentioned with reference to FIG. 1. The switching block 280 provides the output signals of the regular pixel columns 110 to the input ends of the corresponding column ADCs 130 in a normal mode, and provides in common the output signal of the test pixel column 210 to the input ends of the column ADCs 130 in a test mode. This switching operation may be controlled based on a mode control signal.

The system according to the embodiment of the present invention includes the normal mode in which an optical signal is converted into an electrical signal and the test mode in which the performance of the column ADCs is tested. In the normal mode, an optical signal is sensed by each pixel of the regular pixel columns 110 and converted into a digital signal by the column ADCs block 250. In the test mode, the output signal of the test pixel column 210 is provided in common to all of the input ends of the column ADCs 130, and the output signals of the column ADCs 130 are monitored to test the performance of the column ADCs 130.

In the test mode, pixel signals outputted from the resistor string of a pixel column are sequentially go down or up from the first row to the last row. Therefore, a dark-to-white or white-to-dark test mode output may be obtained by obtaining and monitoring the signals of the test pixels through the column ADCs.

Figure 3:
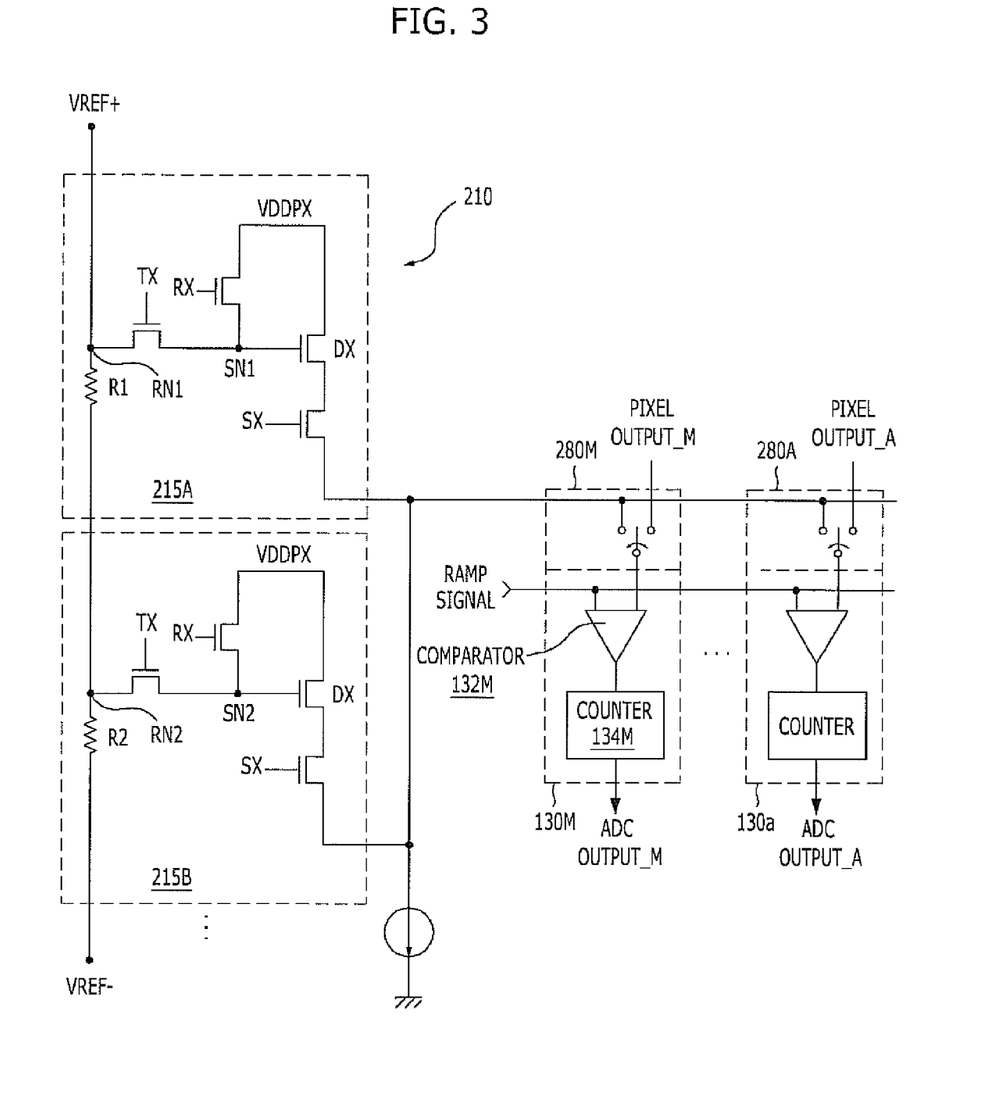
FIG. 3 is a circuit diagram illustrating a test pixel column 210, a switching block 280, and column analog-to-digital converters (ADCs) 130.

FIG. 3 is a circuit diagram illustrating a test pixel column 210, a switching block 280, and column analog-to-digital converters (ADCs) 130.

Referring to FIG. 3, the test pixel column 210 includes a plurality of test pixels 215, and each test pixel 215 has substantially the same structure as the regular pixels. If there is any difference, a photo diode of each regular pixel is substituted with a resistor, and the resistors R of the test pixels of the test pixel column 210 are serially coupled between differential input voltage ends VREF+ and VREF−. More specifically, as well known to those skilled in the art, the test pixels 215 include a pixel transistor network of "4T pixel" architecture. In other words, a first test pixel 215A includes a transfer transistor TX coupled between a node RN1 and a sensing node SN1, a reset transistor RX coupled between the sensing node SN1 and a pixel power source VDDPX, a drive transistor DX as a source follower, and a select transistor SX for selecting a row. The output signal of the test pixel column 210 is transferred to the switching block 280. The output of the test pixel column 210 may be transferred to the switching block 280 through a predetermined signal processing. A first switching block 280M selectively switches and accesses the output PIXEL OUTPUT_M of a regular pixel column 110M and the output of the test pixel column 210 and provides the result as an input of a column ADC 130M. In the normal mode, the output PIXEL OUTPUT_M of the regular pixel column 110M is provided to the column ADC 130M. In the test mode, the output of the test pixel column 210 is provided to the column ADC 130M.

As described above, each column ADC 130 may include a comparator 132 and a counter 134. The comparator 132 receives the ramp signal through one input end. Also, the comparator 132 receives the output of the switching block 280, that is, the output PIXEL OUTPUT of the regular pixel columns 110 or the output of the test pixel column 210 through another input end.

The column ADC 130 detects a crossover point at which the ramp signal crosses the output signal level of the pixel column (which is a regular pixel column or a test pixel column). The crossover point may be detected using analog technique, and in the present embodiment, the comparator 132 is used. Subsequently, the crossover point may be converted into a digital value through digital technique, and in this embodiment, the counter 134 is used to determine a digital code value corresponding to the crossover point.

Figure 4:
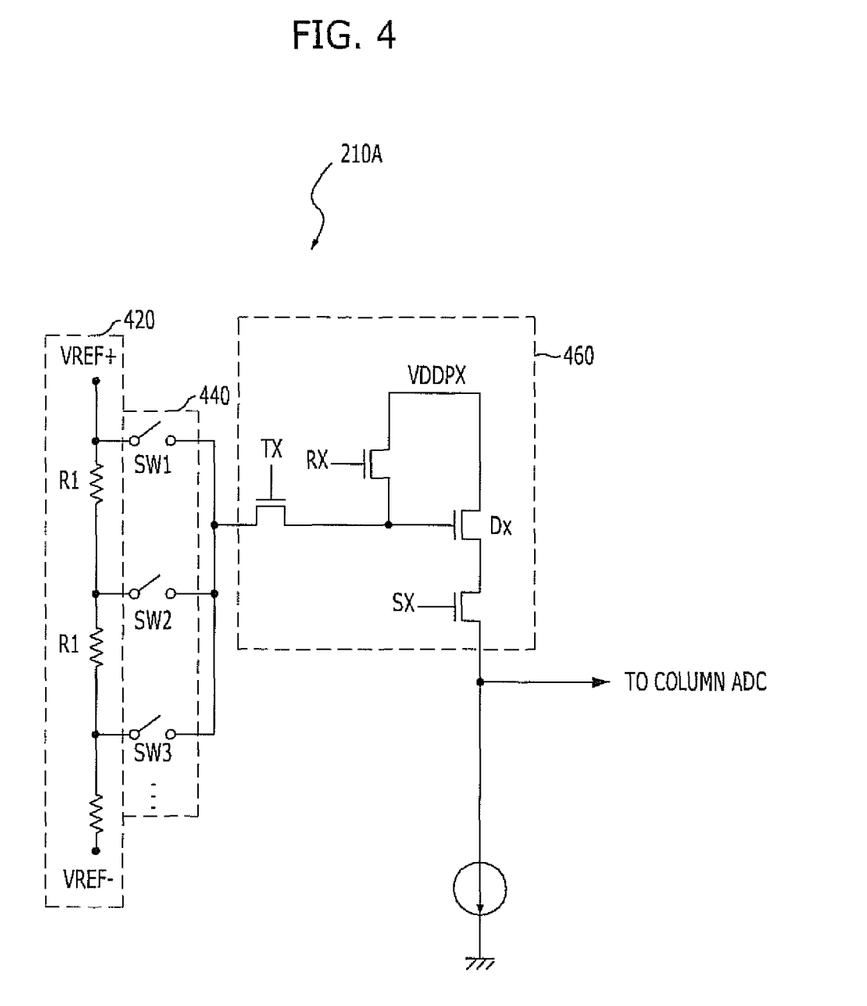
FIG. 4 is a circuit diagram illustrating a test pixel column 210A in accordance with another exemplary embodiment of the present invention.

FIG. 4 is a circuit diagram illustrating a test pixel column 210A in accordance with another embodiment of the present invention. Referring to FIG. 4, the test pixel column 210A includes a resistor string 420, a row switch 440, and a test pixel transistor network 460. The resistor string 420 generates a plurality of reference voltages which increase gradually from one row to another row. The test pixel transistor network 460 has the substantially the same circuit structure as a regular pixel transistor network and provides the column ADCs with its output signals. The row switch 440 sequentially transfers the reference voltages from the resistor string 420 to an input node of the test pixel transistor network 460 based on a row scanning method. To be specific, a first switch SW1, a second switch SW2 and a third switch SW3 are sequentially turned on. Subsequently, the test pixel transistor network 460 senses a signal, and the sensed signal is transferred to the column ADCs 130 after being switched by the switching block 280.

Figure 5:
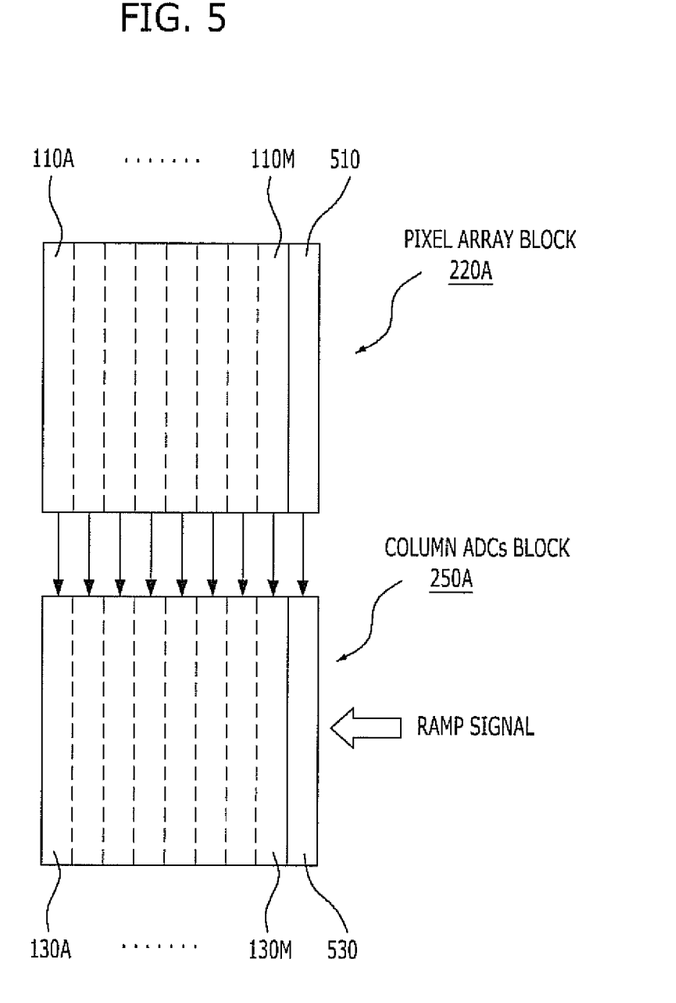
FIG. 5 is a block diagram showing a system block in accordance with a second exemplary embodiment of the present invention.

FIG. 5 is a block diagram of a system block in accordance with a second embodiment of the present invention. Referring to FIG. 5, the system according to the second embodiment of the present invention includes a pixel array block 220A and a column ADCs block 250A.

The pixel array block 220A includes a plurality of regular pixel columns 110 and at least one test pixel column 510. The test pixel column 510 generates signals having a minute voltage difference from one row to another row. The column ADCs block 250A includes a plurality of regular column ADCs 130 which respectively correspond to the regular pixel columns 110. Also, the column ADCs block 250A includes a test column ADC 530 which receives an output signal of the test pixel column 510. The column ADCs block 250A receives a ramp signal, which is the reference signal, as mentioned with reference to FIG. 1.

The system according to the second embodiment of the present invention includes a normal mode in which an optical signal is converted into an electrical signal and processed, and a test mode in which the performance of the column ADCs is tested. In the normal mode, analog optical signals are sensed by the pixels of the regular pixel columns 110, and the column ADCs 130 convert the sensed optical signals into digital signals. In the test mode, the output signal of the test pixel column 510 is transferred to the input end of the test column ADC 530.

Figure 6:
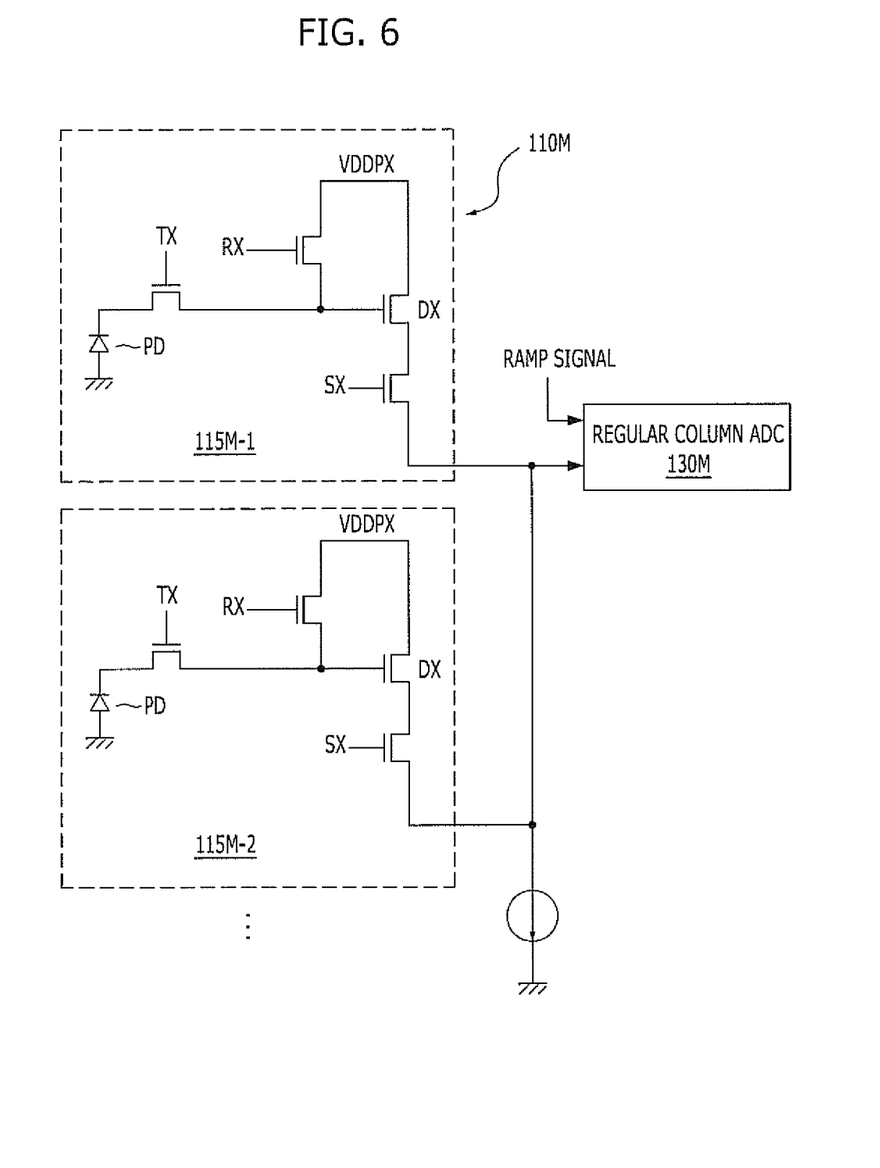
FIG. 6 is a circuit diagram illustrating a regular pixel column 110M and a regular column ADC 130M of the final stage shown in FIG. 5.

FIG. 6 is a circuit diagram illustrating the regular pixel column 110M and the regular column ADC 130M of the final stage. Referring to FIG. 6, the regular pixel column 110M includes a plurality of regular pixels 115M, and each of the regular pixels 115M includes a photo diode (PD), and a regular pixel transistor network which provides the regular column ADC 130M with the signals of the photo diode. The regular pixel transistor network includes a pixel transistor network of "4T pixel" architecture, as well known to those skilled in the art.

Figure 7:
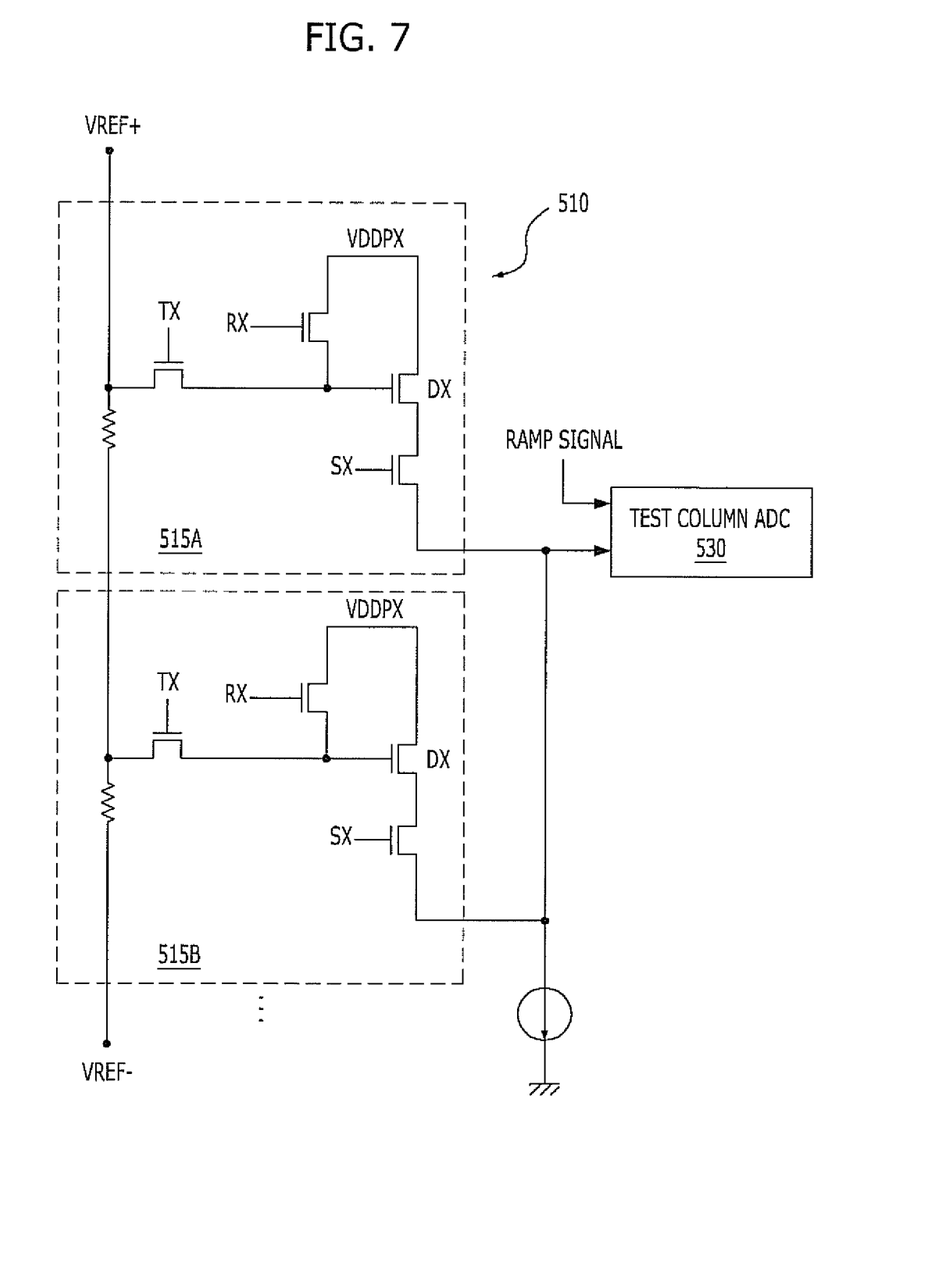
FIG. 7 illustrates a test pixel column 510 and a test column ADC 530 shown in FIG. 5.

FIG. 7 illustrates the test pixel column 510 and the test column ADC 530 in detail. Referring to FIG. 7, the test pixel column 510 includes a plurality of test pixels 215, and each test pixel 215 has substantially the same structure as the regular pixels. If there is any difference, the photo diodes of the regular pixels are substituted with resistors, and the resistors R in the test pixel column 210 are serially coupled between differential input voltages VREF+ and VREF−. The test pixel column 510 is substantially the same as the test pixel column 210 shown in FIG. 3 in its structure and operation. The difference is that the output of the test pixel column 510 is transferred not to the regular column ADCs 130 but to the test column ADC 530. The structure of the test column ADC 530 is substantially the same as those of the regular column ADCs 130. As described above, the system according to the second embodiment of the present invention has a test mode circuit not only in the pixel columns but also the column ADCs as well. The regular column ADCs 130 and the test column ADC 530 may include a comparator and a counter, as illustrated in FIG. 3.

The test column ADC 530 is a replica circuit of the regular column ADC 130, since the circuit structure of the test column ADC 530 is substantially the same as that of the column ADC 130. More specifically, the regular or test column ADC 130 detects a crossover point at which the ramp signal crosses the output signal level of the pixel column (which is a regular pixel column or a test pixel column). The crossover point may be detected using analog technique, and in the present embodiment, a comparator may be used. The crossover point may be converted into a digital value through digital technique, and in this embodiment, a counter may be used to determine a digital code value corresponding to the crossover point.

Meanwhile, the test pixel column 510, as illustrated in FIG. 4, includes a resistor string 420, a row switch 440, and a test pixel transistor network 460. Thus, all rows may share the test pixel transistor network 460.

Figure 8A:
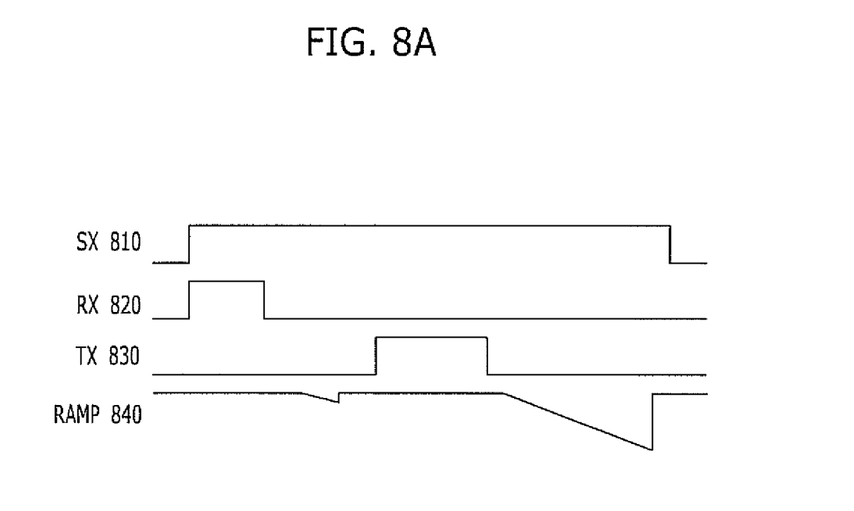
FIG. 8A is a pixel timing diagram in a normal mode.
Figure 8B:
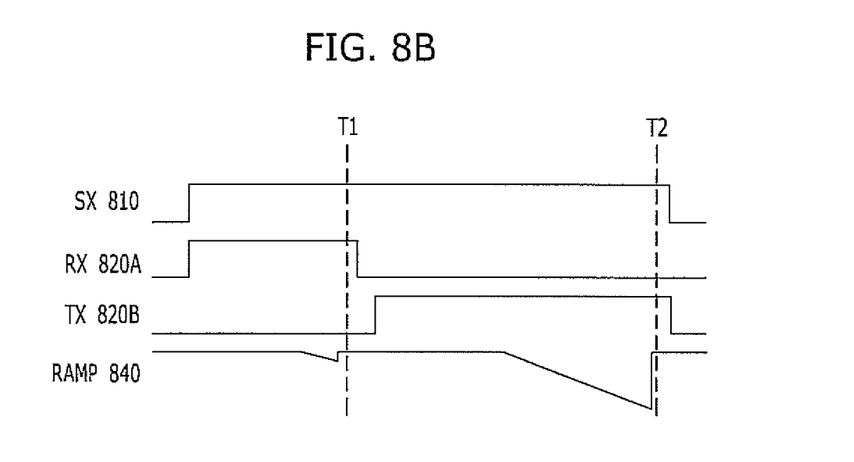
FIG. 8B is a pixel timing diagram in a test mode.

FIG. 8A is a pixel timing diagram in a normal mode, and FIG. 8B is a pixel timing diagram in a test mode. The drawings show operation timings of the regular pixel column circuit and the test pixel column circuit, which are described with reference to the embodiment of FIG. 3.

Referring to FIG. 8A, while a gate signal 810 of a select transistor SX is enabled to a logic high level, a pixel corresponding to any one row of an array is selected. Also, a gate signal 820 of a reset transistor RX is enabled and a reset signal level is sampled. Subsequently, a gate signal 830 of a transfer transistor TX is enabled and an optical signal level is sampled. Then, a noise-free optical signal may be acquired by differentiating the optical signal level by the reset signal level. This operation is known as correlated double sampling (CDS) method.

Referring to FIG. 8B, a test pixel operates with similar timing to the regular pixel. If any, a sufficient amount of power source VDDPX should be applied to a sensing node during the reset operation in the test pixel, a signal 820A should be enabled until after the first down duration T1 of a ramp signal 840. Also, a gate signal 830A of the transfer transistor TX should be enabled until after the second down duration T2 of the ramp signal 840. The timing for the reset transistor RX and the transfer transistor TX is modified from the regular pixel timing in order to remove charge injection noise on the sensing node generated from the reset transistor RX and the transfer transistor TX. In regular pixel operation the transfer transistor TX transistor does not generate kTC or charge injection noise on the sensing node. In normal operation, any kTC noise or charge injection from the RX transistor is removed during the CDS operation.

The image processing system in accordance with an embodiment of the present invention may test the performance of column ADCs without directly irradiating light onto a pixel array and directly applying an external analog value.

While the present invention has been described with respect to the specific embodiments, it will be apparent to those skilled in the art that various changes and modifications may be made without departing from the spirit and scope of the invention as defined in the following claims.

What is claimed is:

1. An image processing system, comprising:
a pixel array including a plurality of regular pixel columns and at least one test pixel column;
a plurality of column analog-to-digital converters (ADCs) configured to correspond to the regular pixel columns and convert analog input signals into digital signals; and
a switching block configured to provide output signals of the regular pixel columns to input ends of the corresponding column ADCs in a normal mode, and provide in common an output signal of the test pixel column to the input ends of the column ADCs in a test mode,
wherein the test pixel column generates a plurality of reference voltages,
wherein each of the reference voltages is increased gradually from one row to another row, and each of the reference voltages is commonly provided to the plurality of column ADCs.

2. The image processing system of claim 1, wherein each of the regular pixel columns comprises a plurality of regular pixels, and each regular pixel comprises a photo diode and a pixel transistor network for providing the column ADCs with a signal of the photo diode, and
the test pixel column comprises a plurality of test pixels, and each test pixel has substantially the same structure as the regular pixel except that the photo diode is substituted with a resistor, and
the resistors in the test pixel column are serially coupled between differential input voltage ends.

3. The image processing system of claim 1, wherein each of the regular pixel columns comprises a plurality of regular pixels, and each regular pixel comprises a photo diode and a regular pixel transistor network for providing the column ADCs with a signal of the photo diode, and
the test pixel column comprises:
a resistor string for generating a plurality of reference voltages which gradually increase from one row to another row;
a test pixel transistor network having substantially the same circuit structure as the regular pixel transistor network and providing the column ADCs with output signals of the test pixel transistor network; and
a row switch for sequentially receiving the reference voltages and transferring the received reference voltages to an input node of the test pixel transistor network.

4. The image processing system of claim 1, wherein the column ADCs comprise:
a crossover point detector for detecting crossover points by comparing output signal levels of the regular pixel columns or the test pixel column with a ramp signal; and
a digital code value generator for generating digital code values corresponding to the crossover points.

5. The image processing system of claim 1, wherein the column ADCs comprise:
a comparator for receiving an output of the switching block through one input end of the comparator and receiving a ramp signal through another input end of the comparator; and
a counter for receiving an output of the comparator and outputting a digital code value.

6. An image processing system, comprising:
a pixel array including a plurality of regular pixel columns and at least one test pixel column;
a plurality of regular column analog-to-digital converters (ADCs) configured to correspond to the regular pixel columns and convert analog input signals of the regular pixel columns into digital signals; and
at least one test column ADC configured to convert analog input signals of the test pixel column into digital signals,
wherein the test pixel column generates a plurality of reference voltages,
wherein each of the reference voltages is increased gradually from one row to another row, and each of the reference voltages is commonly provided to the at least one test column ADC.

7. The image processing system of claim 6, wherein each of the regular pixel columns comprises a plurality of regular pixels, and each regular pixel comprises a photo diode and a pixel transistor network for providing the regular column ADCs with a signal of the photo diode, and
the test pixel column comprises a plurality of test pixels, and each test pixel has substantially the same structure as the regular pixels except that the photo diode is substituted with a resistor, and
the resistor in the test pixel column are serially coupled between differential input voltage ends.

8. The image processing system of claim 6, wherein each of the regular pixel columns comprises a plurality of regular pixels, and each regular pixel comprises a photo diode and a regular pixel transistor network for providing the regular column ADCs with a signal of the photo diode, and
the test pixel column comprises
a resistor string for generating a plurality of reference voltages which gradually increase from one row to another row;
a test pixel transistor network having substantially the same structure as the regular pixel transistor network and providing the test column ADC with output signals of the test pixel transistor network; and
a row switch for sequentially receiving the reference voltages and transferring the received reference voltages to an input node of the test pixel transistor network.

9. The image processing system of claim 6, wherein the at least one test column ADC is a replica circuit of the regular column ADCs, since a circuit structure of the at least one test column ADC is substantially the same as a circuit structure of the regular column ADCs.

10. The image processing system of claim 6, wherein the test column ADC comprises:
a crossover point detector for detecting crossover points by comparing output signal levels of the test pixel column with a ramp signal; and
a digital code value generator for generating digital code values corresponding to the crossover points.

11. The image processing system of claim 6, wherein the at least one test column ADC comprises:
a comparator for receiving an output of the test pixel column through one input end of the comparator and receiving a ramp signal through another input end of the comparator; and
a counter for receiving an output of the comparator and outputting a digital code value.

12. An image processing system, comprising:
a pixel array including a plurality of regular pixel columns and at least one test pixel column;

a plurality of column analog-to-digital converters (ADCs) configured to correspond to the regular pixel columns and convert analog input signals into digital signals; and a switching block configured to provide output signals of the regular pixel columns to input ends of the corresponding column ADCs in a normal mode, and provide in common an output signal of the test pixel column to the input ends of the column ADCs in a test mode, wherein the test pixel column comprises a plurality of test pixels, and each test pixel has substantially the same structure as the regular pixel except that the photo diode is substituted with a resistor, and the resistors in the test pixel column are serially coupled between differential input voltage ends, wherein the test pixel column generates a plurality of reference voltages, wherein each of the reference voltages is increased gradually from one row to another row, and each of the reference voltages is commonly provided to the plurality of ADCs.

* * * * *